United States Patent
Park et al.

(10) Patent No.: US 7,626,330 B2
(45) Date of Patent: Dec. 1, 2009

(54) ORGANIC ELECTROLUMINESCENCE DISPLAY DEVICE

(75) Inventors: Moon-Hee Park, Busan-si (KR);
Chang-Su Seo, Suwon-si (KR);
Sang-Hun Oh, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 452 days.

(21) Appl. No.: 11/062,938

(22) Filed: Feb. 23, 2005

(65) Prior Publication Data

US 2005/0189874 A1 Sep. 1, 2005

(30) Foreign Application Priority Data

Feb. 26, 2004 (KR) .................. 10-2004-0013005

(51) Int. Cl.
*H05B 33/00* (2006.01)
(52) U.S. Cl. .............. 313/504; 313/503; 313/506; 345/92
(58) Field of Classification Search .......... 313/504, 313/506, 512; 315/169.3
See application file for complete search history.

(56) References Cited

U.S. PATENT DOCUMENTS

| | | | |
|---|---|---|---|
| 6,828,726 B2* | 12/2004 | Sakurai et al. | 313/506 |
| 6,850,000 B1* | 2/2005 | Huang et al. | 313/500 |
| 6,885,148 B2* | 4/2005 | Yudasaka | 313/504 |
| 6,992,439 B2* | 1/2006 | Yamazaki et al. | 313/512 |
| 7,265,737 B2* | 9/2007 | Koo et al. | 345/76 |
| 2004/0119399 A1* | 6/2004 | Nagayama | 313/500 |
| 2005/0057151 A1* | 3/2005 | Kuwabara | 313/506 |

FOREIGN PATENT DOCUMENTS

| | | |
|---|---|---|
| CN | 1381898 | 11/2002 |
| CN | 1453883 | 11/2003 |
| KR | 10-2005-0070908 | 7/2005 |

OTHER PUBLICATIONS

Chinese Office Action dated May 9, 2008.

* cited by examiner

*Primary Examiner*—Ashok Patel
(74) *Attorney, Agent, or Firm*—H.C. Park & Associates, PLC

(57) ABSTRACT

An organic electroluminescence display device including a thin film transistor, a first electrode layer, a second electrode layer, and an organic layer. The thin film transistor includes a semiconductor layer, a gate electrode disposed over the semiconductor layer, and source and drain electrodes insulated from the gate electrode. The first electrode layer is coupled to either the source electrode or the drain electrode, and the first electrode layer and the gate electrode are disposed on the same layer. The second electrode layer is disposed above the first electrode layer, and an organic layer, which includes at least a light emitting layer, is interposed between the first electrode layer and the second electrode layer.

10 Claims, 16 Drawing Sheets

ORGANIC ELECTROLUMINESCENCE DISPLAY DEVICE

CROSS REFERENCE TO RELATED APPLICATION

This application claims priority to and the benefit of Korean Patent Application No. 10-2004-0013005, filed on Feb. 26, 2004, which is hereby incorporated by reference for all purposes as if fully set forth herein.

BACKGROUND OF THE INVENTION

1. Field of the Invention

The present invention relates to an organic electroluminescence display device and a method of manufacturing an organic electroluminescence display device, and more particularly, to an organic electroluminescence display device in which a gate electrode of a driving transistor and an electrode of an organic electroluminescence device are patterned simultaneously, thereby reducing the number of masks used in the manufacturing process.

2. Discussion of the Background

Generally, electroluminescence display devices are self-emitting displays in which fluorescent organic compounds are electrically excited to emit light. These display devices may be operated at low voltages, may be formed with thin films, and have wide viewing-angles and rapid response. Therefore, they are regarded as next-generation displays to replace liquid display devices.

Electroluminescence display devices may be inorganic or organic devices according to whether a light-emitting layer comprises an inorganic or organic material.

An organic electroluminescence display device includes an organic film, which may be formed in a predetermined pattern between electrode layers on a transparent insulating substrate, such as glass.

In the organic electroluminescence display device, applying a voltage to an anode electrode causes holes to migrate from the anode to a light emitting layer via a hole transport layer, and applying a voltage to a cathode electrode causes electrons to migrate from the cathode to the light emitting layer via an electron transport layer. The electrons and the holes recombine in the light emitting layer to create excitons, and when the excitons transition from an excited to a ground state, fluorescent molecules of the light emitting layer emit light, thereby forming images.

Active matrix (AM) organic electroluminescence display devices include at least two thin film transistors (TFTs) per pixel. One TFT may be used as a switching device that controls the pixel's operation, and the other may be used as a driving device that drives the pixel.

A TFT includes a semiconductor layer having drain and source regions, which may be doped with highly-concentrated impurities, and having a channel area formed between the drain and source regions, a gate insulator formed on the semiconductor layer, a gate electrode formed on the gate insulator above the channel area, and drain and source electrodes connected to the drain and source regions, respectively, via a contact hole. An interlayer insulator is interposed between the drain and source electrodes and the gate electrode.

FIG. 1 shows an effective display area 110 and a non-effective display area 120 of an organic electroluminescence display device 100. FIG. 2 is a circuit diagram of an image displaying transistor unit 300, which is formed in the effective display area 110, and a driving signal controlling transistor unit 200, which is formed in the non-effective display area 120.

The driving signal controlling transistor unit 200 may include a combination of various transistor logics, and it transmits a driving signal via a scan line to toggle a switching transistor $TFT_{sw}$ 310 of the image displaying transistor unit 300.

The image displaying transistor unit 300 may include at least one switching transistor $TFT_{sw}$ 310, at least one driving transistor $TFT_{dr}$ 320, and a rechargeable capacitor $C_{st}$. The switching transistor $TFT_{sw}$ 310 is driven by a scanning signal Scan, and it transmits a data signal Data applied to a data line. The driving transistor $TFT_{dr}$ determines the amount of current flowing into an organic electroluminescence device OLED via a driving line Vdd according to the data signal transmitted through the switching transistor $TFT_{sw}$, that is, according to the voltage difference (Vgs) between a gate and a source. The rechargeable capacitor $C_{st}$ stores the data signal that is transmitted through the switching transistor $TFT_{sw}$ during one frame.

A conventional method of manufacturing such an organic electroluminescence display device requires as many as 10 masks. The use of so many masks may prolong and complicate the manufacturing process, thereby resulting in higher manufacturing costs.

SUMMARY OF THE INVENTION

The present invention provides a method for manufacturing an organic electroluminescence device that utilizes less pattern masks in order to economically and quickly fabricate the device.

The present invention also provides an organic electroluminescence device that may have improved luminous efficiency.

Additional features of the invention will be set forth in the description which follows, and in part will be apparent from the description, or may be learned by practice of the invention.

The present invention discloses an organic electroluminescence display device comprising a thin film transistor including a semiconductor layer disposed over a substrate, a gate electrode disposed above the semiconductor layer, and source and drain electrodes coupled to source and drain regions of the semiconductor layer, respectively. A first electrode layer is coupled to one of the source and drain electrodes, and it is disposed on the same layer as the gate electrode. A second electrode layer is disposed above the first electrode layer, and an organic layer, interposed between the first electrode layer and the second electrode layer, includes at least a light emitting layer.

The present invention also discloses a method for manufacturing an organic electroluminescence display device, comprising forming a thin film transistor by forming a semiconductor layer disposed over a substrate, a gate electrode disposed above the semiconductor layer, and a source electrode coupled to a source region of the semiconductor layer and a drain electrode coupled to a drain region of the semiconductor layer. A first electrode layer is formed on the same layer as the gate electrode and coupled to either the source electrode or the drain electrode. An organic layer is formed between the first electrode layer and a second electrode layer, and the organic layer has at least a light emitting layer.

The present invention also discloses a method for manufacturing an organic electroluminescence display device including a plurality of imaging transistors disposed in an image area defined by a display substrate and controlling transistors disposed in a non-image area surrounding the image area. The method includes forming a first semiconductor layer, a second semiconductor layer, a third semiconductor layer, and a fourth semiconductor layer by patterning a semiconductor thin film formed on the display substrate using a first pattern mask; first ion-doping both ends of at least one of the first, second, third, and fourth semiconductor layers using a first ion and a second pattern mask after forming a first insulator on the first, second, third, and fourth semiconductor layers; forming on the first insulator gate electrodes corresponding to the first, second, third, and forth semiconductor layers, and a first electrode layer in a predetermined portion where a light emitting layer is to be disposed, using a third pattern mask; second ion doping both ends of at least one of the first, second, third, and fourth semiconductor layers using a fourth pattern mask; forming in a second insulator formed on the first insulator contact holes extending to the ion-doped areas using a fifth pattern mask, and removing a portion of the second insulator disposed on the first electrode layer; forming a source electrode and a drain electrode extending through the contact holes on the second insulator using a sixth pattern mask such that one of the source electrode and the drain electrode is coupled to the first electrode layer; and patterning a pixel defining area using a seventh pattern mask after forming a planarizing layer on the source electrode and the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 3:
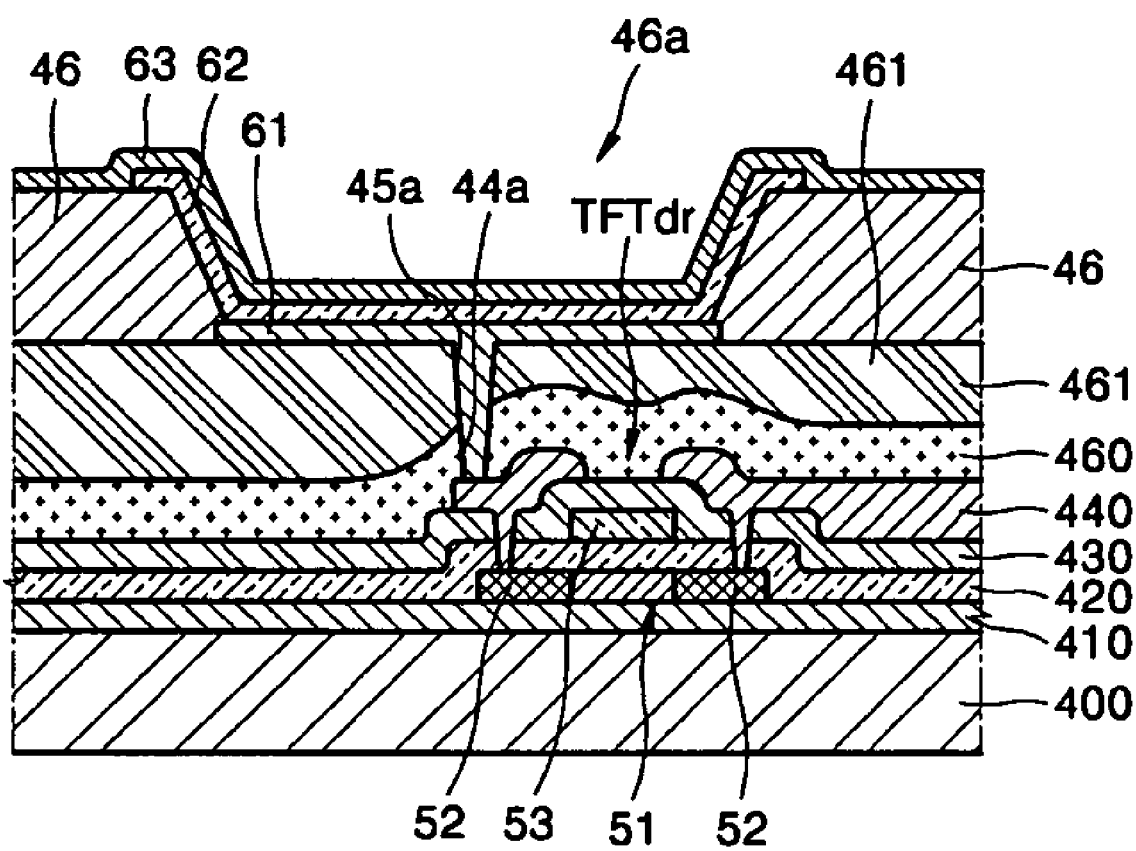
FIG. 3 is a sectional view of a conventional organic electroluminescence display device.

FIG. 3 is a sectional view showing a portion of a conventional organic electroluminescence display device including a driving transistor $TFT_{dr}$. Referring to FIG. 3, a buffer layer 410, a TFT, and an OLED are sequentially formed on a glass substrate 400.

The organic electroluminescence display device of FIG. 3 may be manufactured in the following manner.

First, a buffer layer 410 is formed on a substrate 400. A semiconductor layer 51 is formed in a predetermined pattern on the buffer layer 410. A gate insulator 420, which may be made of a material such as $SiO_2$, is formed on the semiconductor layer 51, and a gate electrode 53, which may be made of a material such as MoW or Al/Cu, is formed on a predetermined portion of an upper surface of the gate insulator 420. The gate electrode 53 may be coupled to a gate line (not shown) supplying TFT on/off signals. An inter-insulator 430 is formed on the gate electrode 53. Source and drain electrodes 440 may contact source and drain regions 52, respectively, of the semiconductor layer 51 via contact holes. A passivation layer 460 is formed on the source and drain electrodes 440, and a planarizing layer 461 is formed on the passivation layer 460. The passivation layer 460 may comprise $SiO_2$ or SiNx, and the planarizing layer 461 may comprise an organic material such as acryl, polyimide, or BCB.

Via holes 44a and 45a extending to the source and drain electrodes 440 may be formed in the passivation layer 460 and the planarizing layer 461 using photolithography or punching. A first electrode layer 61, as an anode electrode, may be formed on the planarizing layer 461 and be coupled to the source or drain electrode 440. An organic pixel defining layer 46 may be formed to cover the first electrode layer 61. A predetermined aperture 46a is formed in the pixel defining layer 46, and an organic layer 62, including a light emitting layer, is formed in an area defined by the aperture 46a. A second electrode layer 63, as a cathode electrode, may be formed to cover the organic layer 62. Holes and electrons may be injected into a portion of the organic layer 62 interposed between the first electrode layer 61 and the second electrode layer 63 to emit light.

The driving signal controlling transistor unit 200, which acts as a driving integrated circuit (IC), formed in the non-effective display area 120, and the image displaying transistor unit 300 may be formed at the same time.

FIG. 4, FIG. 5, FIG. 6, FIG. 7, FIG. 8, FIG. 9, FIG. 10 and FIG. 11 show a manufacturing process in which controlling transistors $TFT_{ctl}$ 210 and 220 are formed in the non-effective display area 120 and a switching transistor $TFT_{sw}$ 310, a driving transistor $TFT_{dr}$ 320, and a rechargeable capacitor $C_{st}$ are formed in the effective display area 110.

Figure 4:
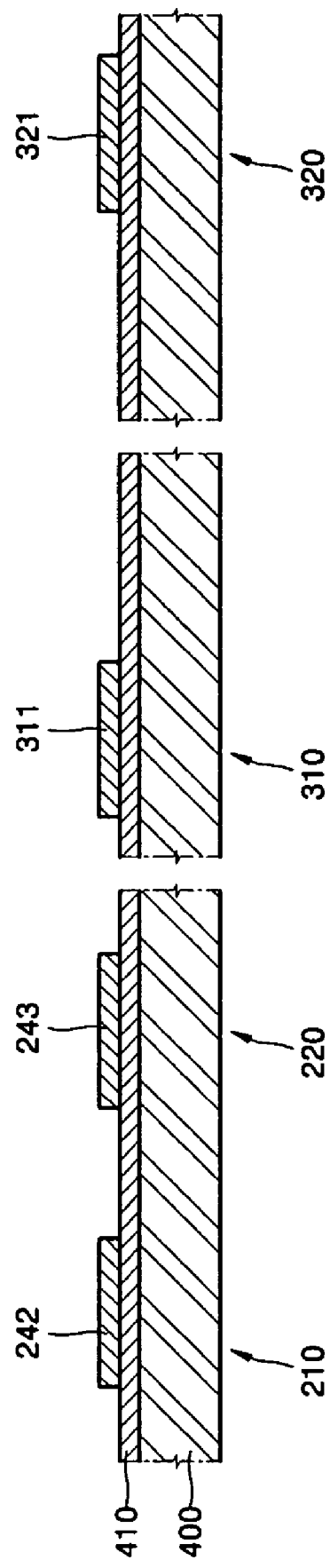
FIG. 4, FIG. 5, FIG. 6, FIG. 7, FIG. 8, FIG. 9, FIG. 10 and FIG. 11 are sectional views showing a method of manufacturing a conventional organic electroluminescence display device.

Referring to FIG. 4, a buffer layer 410 is formed on the entire upper surface of a display substrate 400, and a poly-silicon thin film layer is formed to a predetermined thickness on the buffer layer 410.

A photoresist thin film is formed on the poly-silicon thin film layer. Using a first pattern mask, a plurality of semiconductor layers 242, 243, 311, and 321 having predetermined areas are respectively formed in regions corresponding to a plurality of subsequently formed TFTs 210, 220, 310, and 320.

Figure 5:
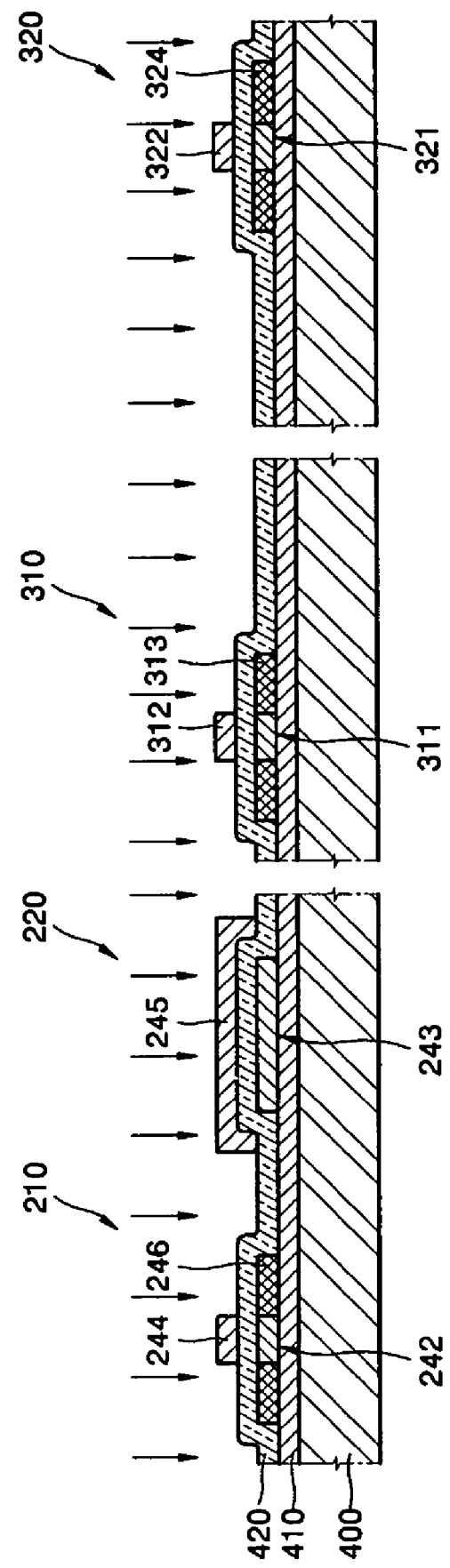

The TFTs 210 and 220, which are formed in the non-effective display area 120, may include a N type semiconductor layer 242 and a P type semiconductor layer 243, respectively. The thin film transistors 310 and 320, which are formed in the effective display area 110, include a first semiconductor layer 311 and a second semiconductor layer 321, respectively. Referring to FIG. 5, after forming the semiconductor layers 311 and 321 using the first pattern mask, a first insulator 420 is formed to a predetermined thickness on the buffer layer 410 and the semiconductor layers 242, 243, 311, and 321.

A plurality of ion barrier layers 244, 245, 312, and 322, which are patterned using a second pattern mask, are formed on an upper surface of the first insulator 420. Ion injecting equipment is used to ion dope portions of the semiconductor layers 242, 243, 311, and 321 that are not shielded by the ion barrier layers 244, 245, 312, and 322 with an N dopant, thereby forming ion doping regions 246, 313, and 324.

Figure 6:
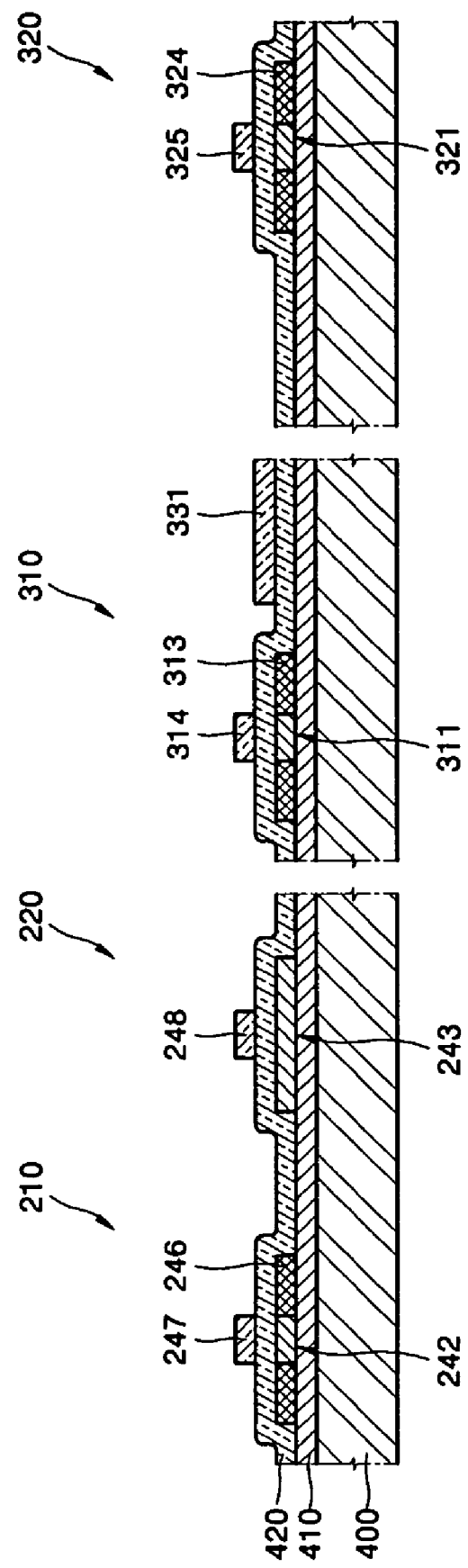

Referring to FIG. 6, the ion barrier layers 244, 245, 312, 322 are removed after completing the ion doping. A conducting gate material is then deposited to a predetermined thickness on the first insulator 420 to form a gate thin film and patterned using a third pattern mask, thereby forming gate electrodes 247, 248, 314, and 325. Additionally, a portion of the gate thin film is used to form a first electrode 331 of the rechargeable capacitor $C_{st}$.

Figure 7:
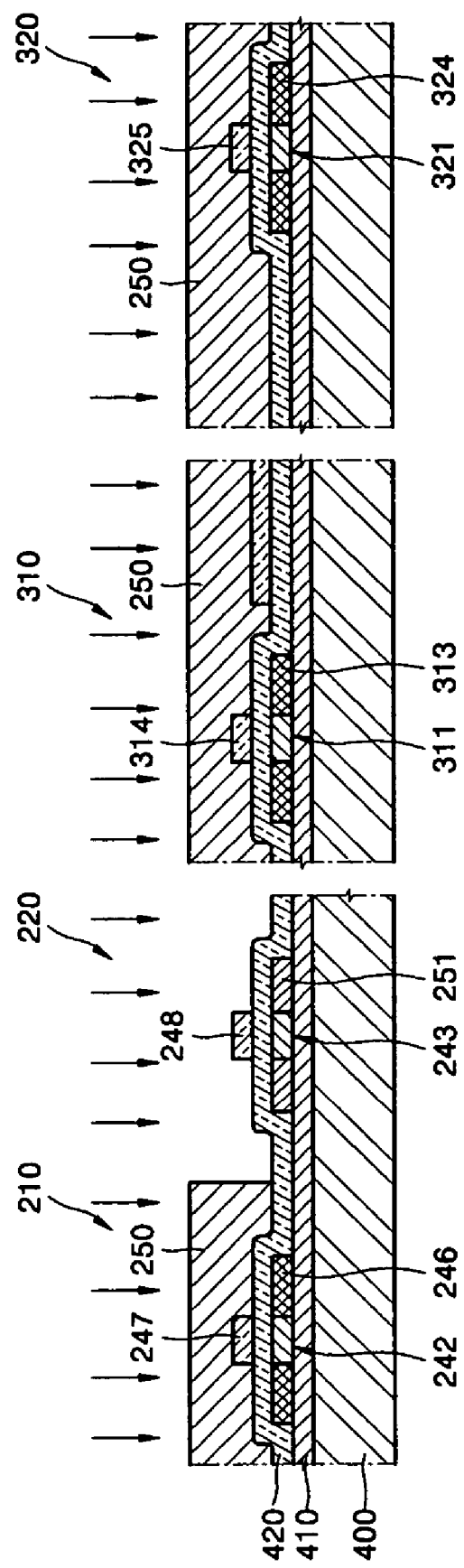

Referring to FIG. 7, using a fourth pattern mask, a photoresist pattern 250 is formed on the gate electrodes 247, 314, and 325, the first electrode 331 and the first insulator 420. It is not formed on the region adjacent to the gate electrode 248. The semiconductor layer 243 is then ion-doped with a P type dopant, thereby forming an ion doping region 251 in the P type semiconductor layer 243.

Figure 8:
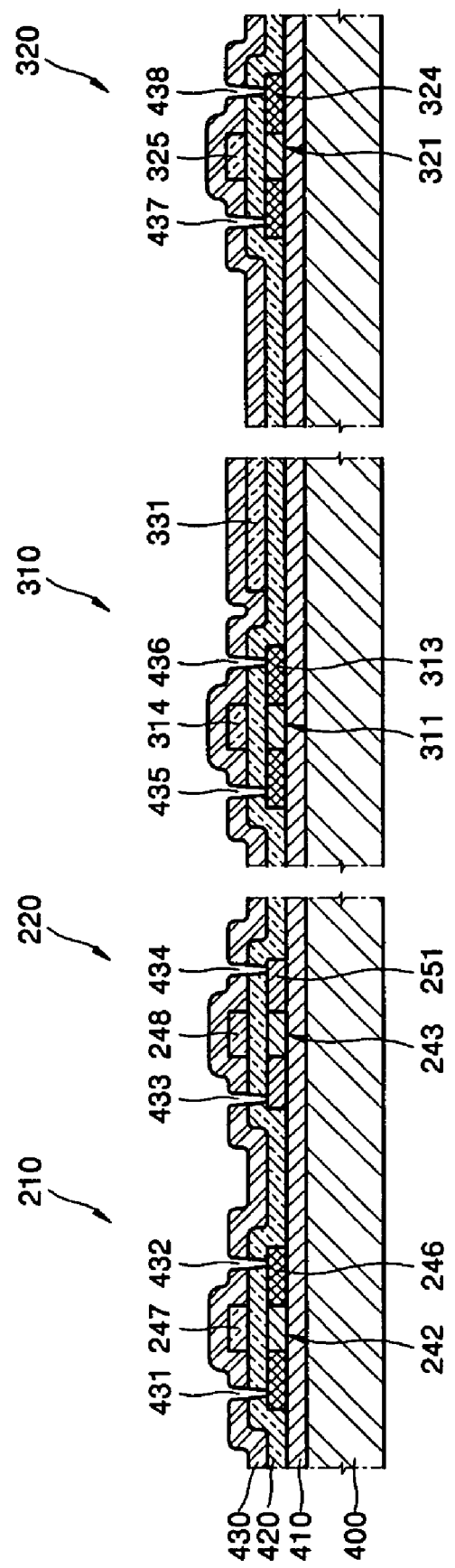

Referring to FIG. 8, after removing the photoresist pattern 250, a second insulator 430 is formed to a predetermined thickness on the first insulator 420, the first electrode 331, and the gate electrodes 247, 248, 314, and 325. The second insulator 430 is patterned using a fifth pattern mask to form contact holes 431, 432, 433, 434, 435, 436, 437, and 438 in portions of the first and second insulators 420 and 430 corresponding to upper surfaces of the ion doping area 246 of the N type semiconductor layer 242, the ion doping area 251 of the P type semiconductor layer 243, the ion doping area 313 of the first semiconductor layer 311, and the ion doping area 324 of the second semiconductor layer 321, respectively.

Figure 9:
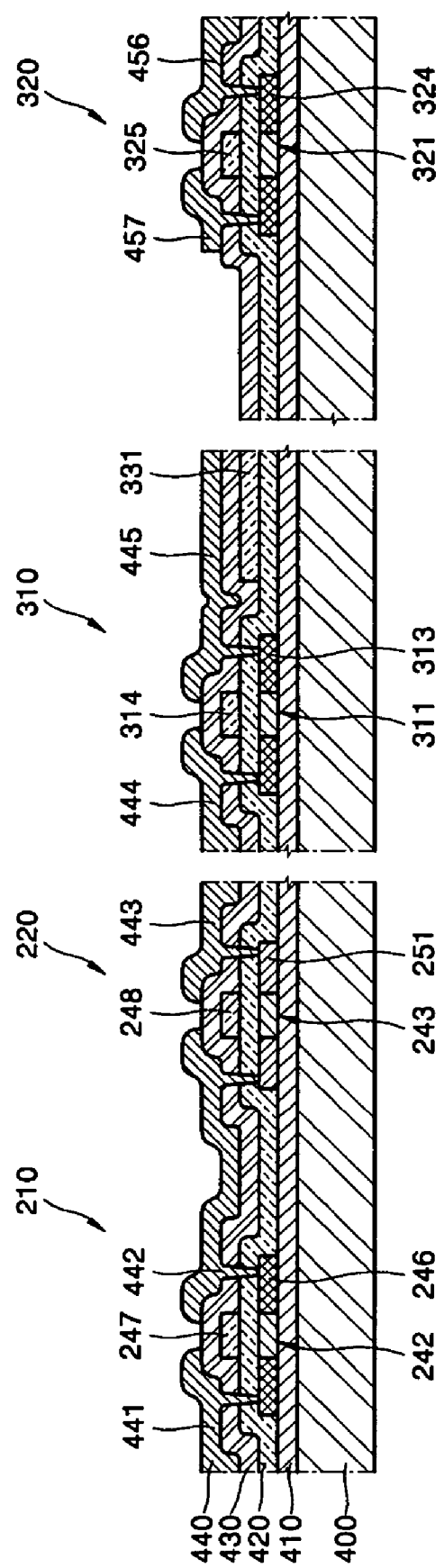

Referring to FIG. 9, a source/drain metal layer 440 is formed to a predetermined thickness on the second insulator 430, while filling the contact holes 431, 432, 433, 434, 435, 436, 437, and 438. The source/drain metal layer 440 is patterned using a sixth pattern mask.

Figure 2:
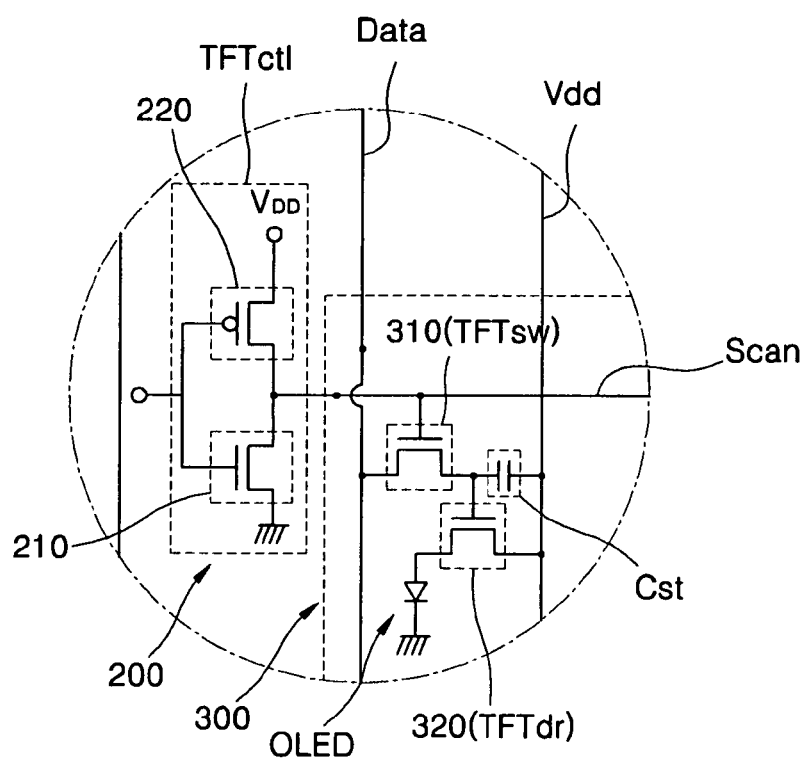
FIG. 2 is a simplified circuit diagram showing an image displaying transistor unit formed in the effective display area and a driving signal controlling transistor unit formed in the non-effective display area of the organic electroluminescence display device of FIG. 1.

A portion of a drain electrode 445 formed above the first electrode 331 acts as a second electrode of the rechargeable capacitor $C_{st}$, and the second insulator 430, which is interposed between the drain electrode 445 and the first electrode 331, acts as a dielectric. As shown in FIG. 2, a portion of the second electrode of the rechargeable capacitor $C_{st}$ is coupled to a gate electrode of the second transistor 320, and a source electrode of the second transistor 320 is coupled to a driving line Vdd.

Figure 10:
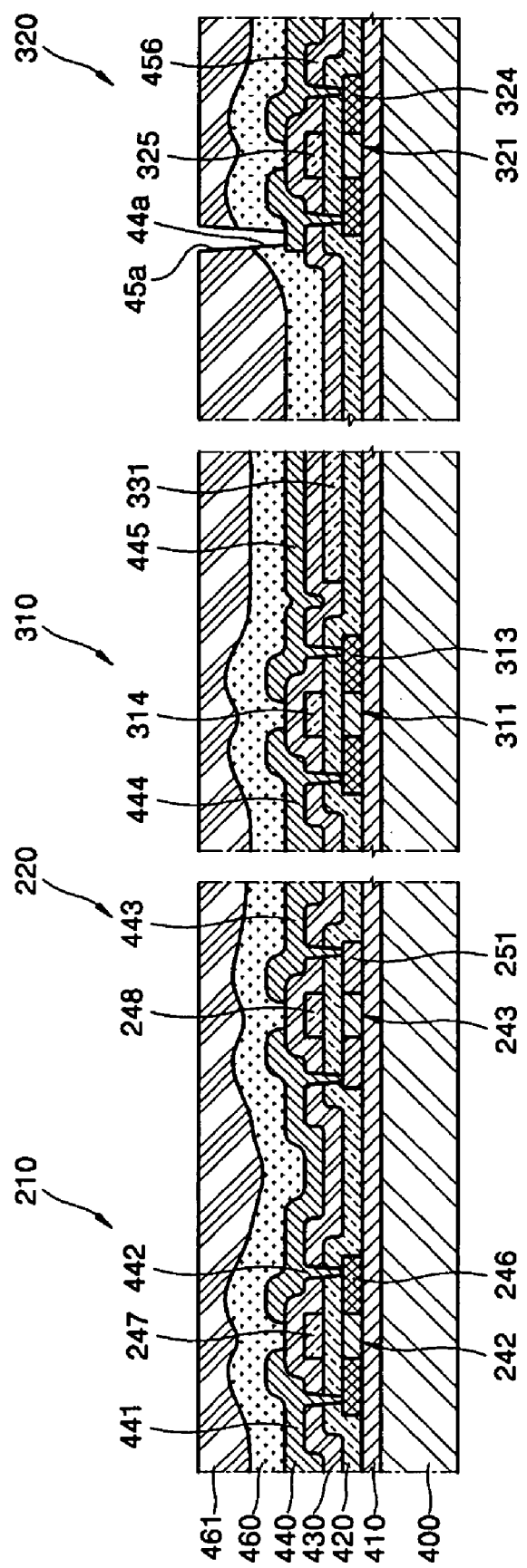

Referring to FIG. 10, a passivation layer 460 is formed on the source/drain metal layer 440 and the second insulator 430 and then patterned using a seventh pattern mask to form a first via hole 44a. A planarizing layer 461 is formed on the passivation layer 460 and patterned using an eighth pattern mask to form a second via hole 45a, which is connected to the first via hole 44a.

Figure 11:
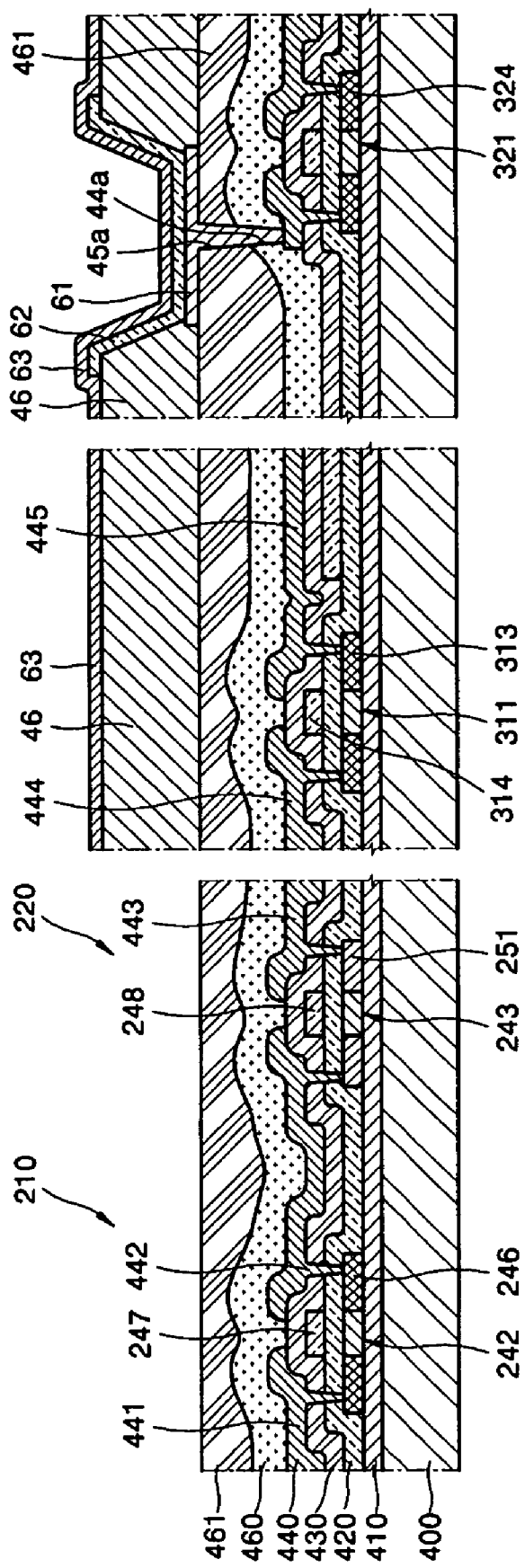

Referring to FIG. 11, an anode layer 61 is formed on the planarizing layer 461 using a ninth pattern mask such that the first electrode layer 61 is coupled to the source or drain electrode 440 via the first via hole 44a and the second via hole 45a. A pixel defining layer (PDL) 46, which may be made of materials such as acryl, BCB, or polyimide, is then formed on the first electrode layer 61 using a tenth mask. After forming the PDL 46, an organic layer 62 and a cathode layer 63 are dry-coated to complete the organic electroluminescence display device.

Hereinafter, an exemplary embodiment of the present invention will be described with reference to accompanying drawings.

Figure 12:
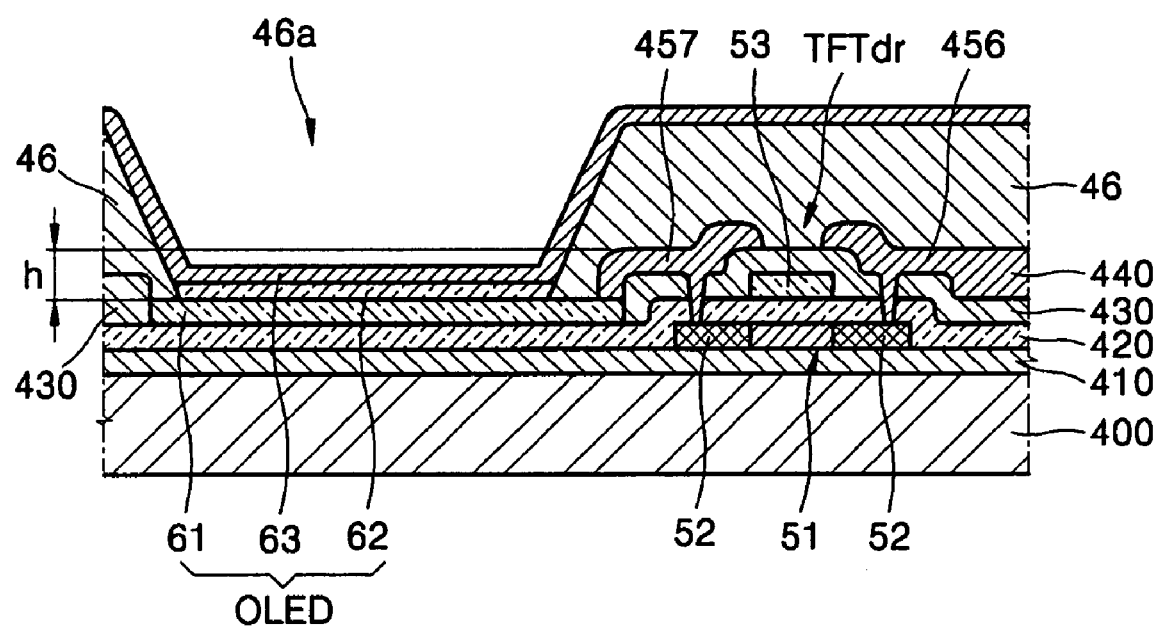
FIG. 12 is a sectional view of an organic electroluminescence display device according to an exemplary embodiment of the present invention.

FIG. 12 is a sectional view of an organic electroluminescence display device according to an exemplary embodiment of the present invention. In particular, FIG. 12 shows a portion of the organic electroluminescence display device including a driving transistor $TFT_{dr}$ and a pixel defining area connected thereto.

Referring to FIG. 12, a buffer layer 410 is formed on a display substrate 400, and a semiconductor layer 51, a gate electrode 53, and source and drain electrodes 456 and 457 are disposed on an upper surface of the buffer layer 410.

A first insulator 420 is interposed between the semiconductor layer 51 and the gate electrode 53. A second insulator 430 is interposed between the gate electrode 53, and the source and drain electrodes 456 and 457. The source and drain electrodes 456 and 457 are coupled to source and drain regions 52, respectively, of the semiconductor layer 51 through contact holes.

A first electrode layer 61 of an organic electroluminescence device OLED may be formed as an anode layer on the first insulator 420. The first electrode layer 61 may contact either the source electrode or drain electrode 456 and 457. Therefore, unlike a conventional electroluminescence display device, the electroluminescence display device according to an exemplary embodiment of the present invention does not have a via hole coupling the OLED and the driving transistor $TFT_{dr}$. Since the first electrode layer 61 and the gate electrode 53 may comprise the same material, they may be formed simultaneously, thereby shortening the manufacturing process. As noted above, either the source or drain electrode of the driving TFT may be coupled to the OLED. In the embodiment shown in FIG. 12, the drain electrode 457 is coupled to the OLED.

An organic layer 62 and a second electrode layer 63, which acts as a cathode when the first electrode layer 61 acts as an anode, may be sequentially deposited on the first electrode layer 61 to complete the OLED.

A second insulator 430, which is interposed between the gate electrode 53 and the source and drain electrodes 456 and 457, may be divided into two regions separated by the first electrode layer 61. Therefore, the source and drain electrodes 456 and 457, which are formed on the second insulator 430, may be disposed above the first electrode layer 61. If a portion of the organic layer 62 does not extend above a height h of the source and drain electrodes 456 and 457, light emitted laterally from the organic layer 62 may reflect from a side of the source or drain electrode 456 and 457 or from a side portion of signal lines coupled to the source or drain electrode 456 and 457, which enhances luminous efficiency. For example, the organic layer 62 may be disposed adjacent to the source or drain electrode 456 or 457, a data line Data of FIG. 2, or a driving line Vdd of FIG. 2, all of which may be disposed on the second insulator 430.

Therefore, the adjacent data line Data and the adjacent driving line Vdd or the source or drain electrode 456 or 457 may reflect light emitted from the organic layer 62, which may improve the organic electroluminescence display device's brightness.

The first electrode layer 61 and/or the gate electrode 53 may be a metal-containing reflecting electrode that reflects light emitted toward the substrate 400 to the organic layer 62. The first electrode layer 61 and/or the gate electrode 53 may comprise at least one of Mo, MoW, Cr, Ni, Al, an Al alloy, Ag, ITO, and IZO, which have high work functions. Also, the first electrode layer 61 and/or the gate electrode 53 may comprise two or three layers including one layer comprising at least one low resistance metal, such as Mo, MoW, Cr, Ni, Al, an Al alloy, or Ag, and another layer comprising at least one of ITO and IZO.

The organic layer 62, which includes a light emitting layer, is interposed between the first electrode layer 61 and the second electrode layer 63. The organic layer 62 may be a low weight molecular organic layer or a polymer organic layer. If it is a low weight molecular organic layer, it may include a hole injection layer (HIL), a hole transport layer (HTL), an organic emission layer (EML), an electron transport layer (ETL), an electron injection layer (EIL), or a composite structure of these. In this case, the organic layer 62 may comprise copper phthalocyanine (CuPc), N,N'-di(naphthalene-1-yl)-N,N'-diphenyl-benzidine (NPB), tris-8-hydroxyquinoline aluminum (Alq3), or other like substances. The low weight molecular organic layer may be formed using a dry deposition method.

The polymer organic layer may include an HTL and an EML. The HTL may comprise polyethylenethioxythiophene (PEDOT), and the EML may comprise poly-phenylenevinylenes (PPV), polyfluorenes, or other like substances. The polymer organic layer may be formed using screen printing, inkjet printing, or other like methods.

The organic layer is not limited to the above description, as it may have many forms.

The organic electroluminescence display device according to an exemplary embodiment of the present invention may be manufactured using less masks than conventionally, and it may have enhanced luminous efficiency. A method of manufacturing an organic electroluminescence display device according to an exemplary embodiment of the present invention will now be described.

Figure 1:
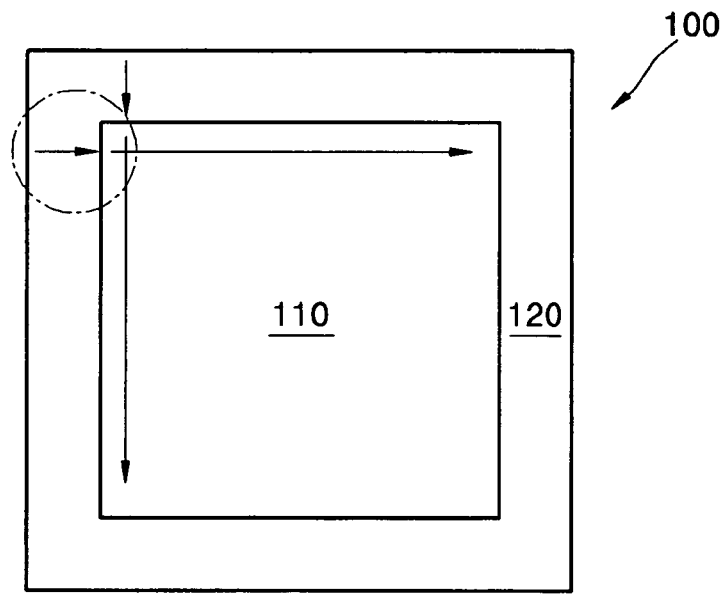
FIG. 1 is a schematic diagram showing an effective display area and a non-effective display area of an organic electroluminescence display device.

An effective display area 110 and a non-effective display area 120 may be divided as shown in FIG. 1, and an image displaying transistor unit 300 and a driving signal controlling transistor unit 200 may have the same connections as in the circuit diagram of FIG. 2.

The image displaying transistor unit 300 may include at least one switching transistor $TFT_{sw}$, at least one of driving transistor $TFT_{dr}$, and a rechargeable capacitor $C_{st}$ per pixel. Each pixel may be coupled to a scan line Scan, a data line Data, and a driving line Vdd. The image displaying transistor unit 300 may have additional TFTs and capacitors.

In FIG. 13, FIG. 14, FIG. 15, FIG. 16 and FIG. 17, controlling transistors 210 and 220 may be formed in the non-effective display area 120 when a switching transistor $TFT_{sw}$ 310, a driving transistor $TFT_{dr}$ 320 and a rechargeable capacitor $C_{st}$ are formed in the effective display area 110.

Figure 13:
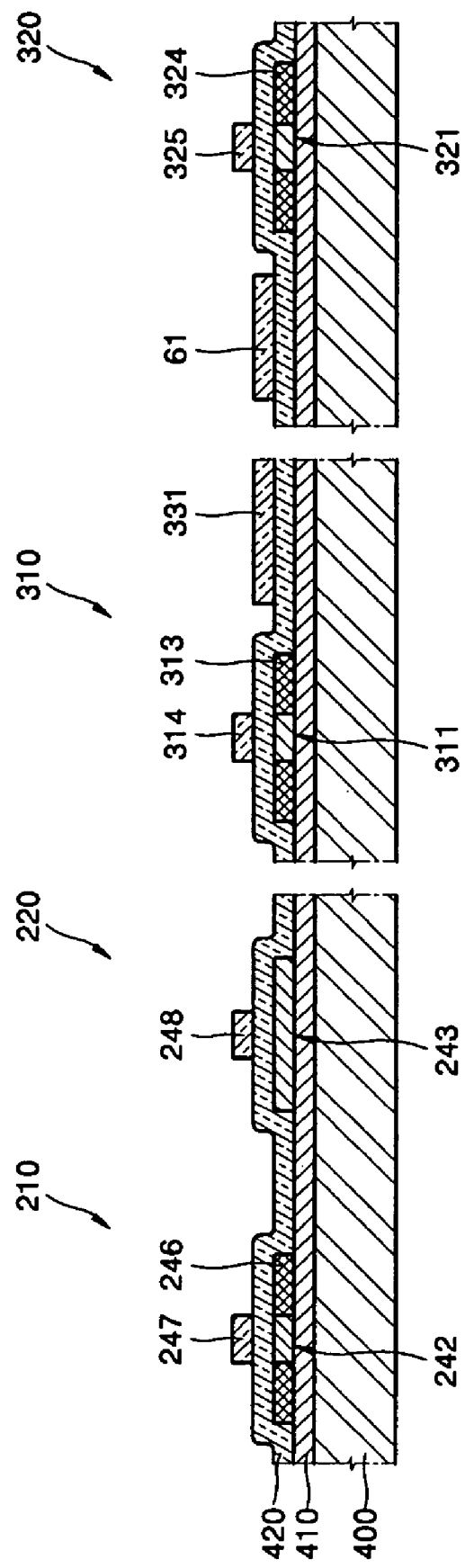
FIG. 13, FIG. 14, FIG. 15, FIG. 16, FIG. 17 are sectional views showing a method of manufacturing an organic electroluminescence display device according to an exemplary embodiment of the present invention.

Referring to FIG. 13, a buffer layer 410 may be formed on the entire surface of a display substrate 400 having a predetermined area.

If the display substrate 400 has alkali, the buffer layer 410 prevents diffusion of impure ions from the display substrate 400 into a TFT formed above it. On the other hand, if the display substrate 400 is alkali-free, the buffer layer 410 may be omitted. The buffer layer 410, which may comprise $SiO_2$ or other like substances, may be deposited at about 3000 Å thick using a variety of methods, such as Plasma Enhanced Chemical Vapor Deposition (PECVD), Atmospheric Pressure Chemical Vapor Deposition (APCVD), Low Pressure Chemical Vapor Deposition (LPCVD), and Electron Cyclotron Resonance (ECR).

A poly silicon thin film layer, which may be about 500 Å thick, may be formed on the buffer layer 410 or the display substrate 400 using a variety of methods. For example, amorphous silicon formed on the display substrate 400 or the buffer layer 410 may be transformed into poly silicon by a laser crystallization process. Alternatively, poly silicon may be directly formed on the display substrate 400 or the buffer layer 410.

A photoresist thin film is formed on the poly silicon thin film layer. Then, using a first pattern mask, semiconductor layers 242, 243, 311, and 321 having predetermined areas may be formed in regions corresponding to the TFTs 210, 220, 310 and 320.

The two TFTs to be formed in the non-effective display area 120 may be an N type transistor 210 and a P type transistor 220. The two TFTs to be formed in the effective display area 110 may be a switching transistor $TFT_{sw}$ 310 and a driving transistor $TFT_{dr}$ 320, respectively. The N type transistor 210 includes an N type semiconductor layer 242, the P type transistor 220 includes a P type semiconductor layer 243, the switching transistor 310 $TFT_{sw}$ includes a first semiconductor layer 311, and the driving transistor 320 $TFT_{dr}$ includes a second semiconductor layer 321. After forming the semiconductor layers 242, 243, 311, and 321, a first insulator 420 may be formed to a predetermined thickness on the buffer layer 410 and the semiconductor layers 242, 243, 311, and 321 using a process shown in FIG. 5.

The first insulator 420, which is a gate insulator, insulates the semiconductor layers 242, 243, 311, and 321 from the gate electrodes 247, 248, 314, and 325, which are formed on an upper surface of the first insulator 420.

Similar to the process shown in FIG. 5, ion barrier layers 244, 245, 312, and 322, which are patterned using a second pattern mask, may be formed on the upper surface of the first insulator 420. Then, high density ion doping may be performed using ion injecting equipment to ion dope, with an N dopant, portions of semiconductor layers 242, 243, 311, and 321 that are not shielded by the ion barrier layers 244, 245, 312, and 322, thereby forming ion doping areas 246, 313, and 324.

After removing the ion barrier layers 244, 245, 312, and 322, a conducting metal material may be deposited to a predetermined thickness on the first insulator 420 to form a gate thin film and a first electrode layer. The gate thin film and the first electrode layer may then be patterned using a third pattern mask, thereby forming gate electrodes 247, 248, 314, and 325, a first electrode 331 of the rechargeable capacitor $C_{st}$, and a first electrode layer 61 of the OLED.

If desired, the first electrode 331 of the rechargeable capacitor $C_{st}$ may be formed simultaneously with the gate electrodes 247, 248, 314, and 325, and the first electrode layer 61.

The gate electrodes 247, 248, 314, and 325 and the first electrode layer 61 may comprise a metallic material having a high work function. If the gate electrodes 247, 248, 314, and 325 and the first electrode layer 61 are formed from a single film, the single film may comprise at least one of Mo, MoW, Cr, Ni, Al, Al alloy, Ag, ITO, and IZO. The gate electrodes 247, 248, 314, and 325 and the first electrode layer 61 may also be formed as two or three layers, wherein one layer comprises at least one low resistance metal, such as Mo, MoW, Cr, Ni, Al, Al alloy, or Ag, and another layer comprises at least one high work function metal, such as ITO or IZO.

Figure 14:
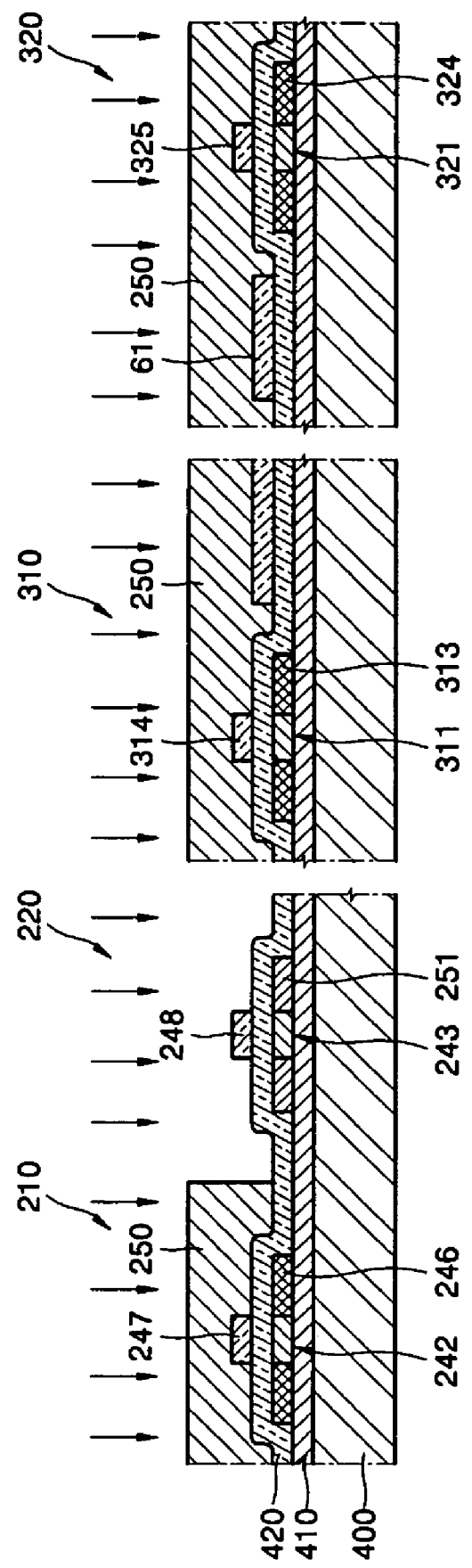

Referring to FIG. 14, after patterning gate electrodes 247, 248, 314, 325 and the first electrode layer 61, the P type semiconductor layer 243 is ion doped with a P type dopant using a photoresist pattern 250, which is formed using a fourth pattern mask. As a result, the P type semiconductor layer 243 is ion-doped to form an ion doped area 251.

Figure 15:
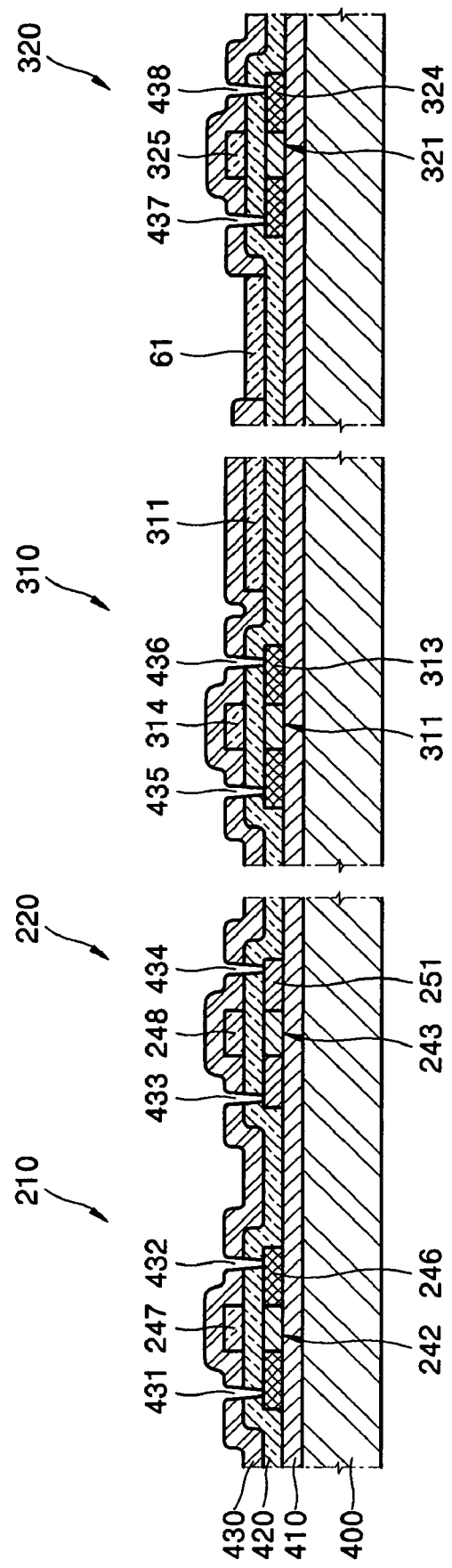

Referring to FIG. 15, the photoresist pattern 250 is removed, and a second insulator 430 is formed to a predetermined thickness on the first insulator 420, the gate electrodes 247, 248, 314, and 325, the first electrode layer 61, and the first electrode 331. The second insulator 430 is patterned using a fifth pattern mask to form contact holes 431, 432, 433, 434, 435, 436, 437, and 438 that extend to the ion doping area 246 of the N type semiconductor layer 242, the ion doping area 251 of the P type semiconductor layer, and ion doping areas 313 and 324 of the first and second semiconductor layers 311 and 321. The fifth pattern mask is formed so that the second insulator 430 may be removed from above the first electrode layer 61 in order to form a light emitting area.

Figure 16:
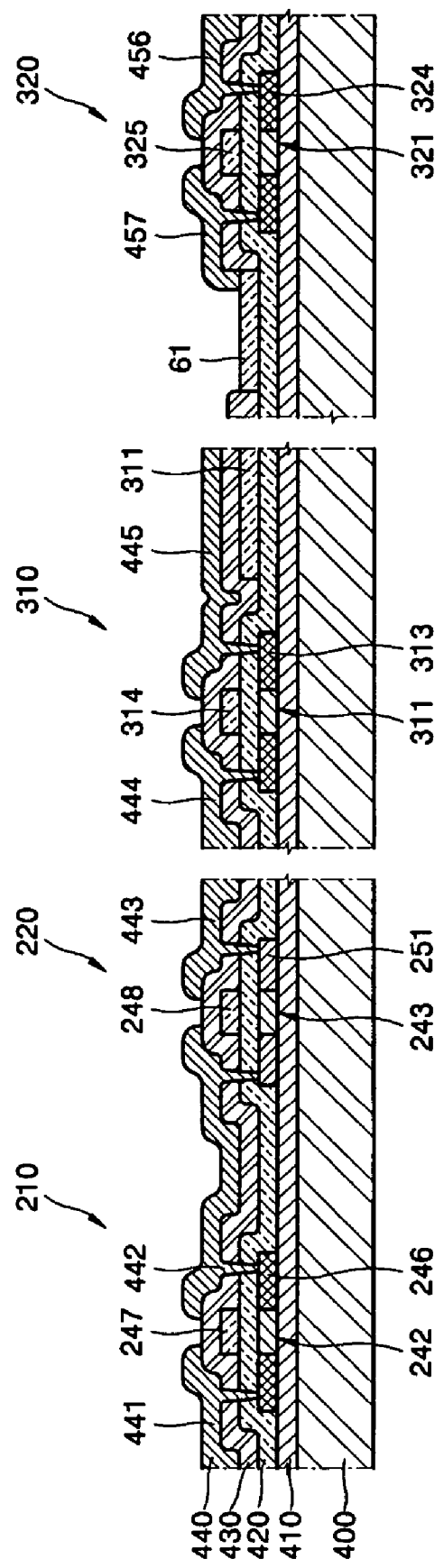

Referring to FIG. 16, a conducting source/drain metal may be deposited to a predetermined thickness on the second insulator 430 and in the contact holes 431, 432, 433, 434, 435, 436, 437, and 438 to form a source/drain metal layer 440. The source/drain metal layer 440 is patterned using a sixth pattern mask to form a source electrode 444 and a drain electrode 445 of the switching transistor $TFT_{sw}$ 310, and a source electrode 456 and a drain electrode 457 of the driving transistor $TFT_{dr}$ 320. The sixth pattern mask is formed so that a portion of the source/drain metal layer 440 may be removed from the first electrode layer 61, thereby permitting the first electrode layer 61 to contact either the source electrode 456 or the drain electrode 457. FIG. 16 shows an embodiment where the first electrode layer 61 contacts the drain electrode 457.

A portion of the drain electrode 445 disposed above the first electrode 311 of the rechargeable capacitor $C_{st}$ 330 may act as a second electrode of the rechargeable capacitor $C_{st}$, and a portion of the second insulator 430 interposed between the drain electrode 445 and the first electrode 311 may act as a dielectric. Depending on a circuit design, a portion of the second electrode of the rechargeable capacitor $C_{st}$ may be coupled to a gate electrode 325 in the driving $TFT_{dr}$ 320, and the source electrode 456 of the driving $TFT_{dr}$ 320 may be coupled to a driving line Vdd (FIG. 2).

Figure 17:
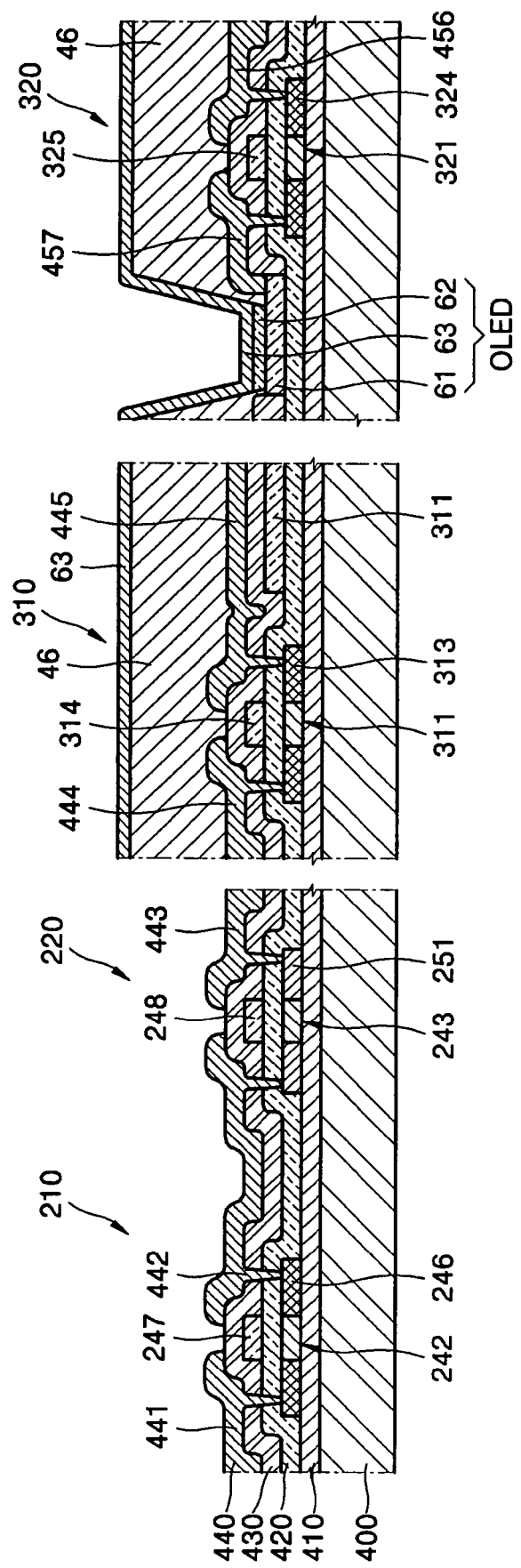

Referring to FIG. 17, after forming a planarizing layer 46 on the second insulator 430, the first electrode layer 61, and the source/drain material layer 440, a portion of the planarizing layer 46 is removed to expose the first electrode layer 61 using a seventh pattern mask, thereby forming an open area for the OLED. In other words, a light emitting area is patterned to expose the first electrode 61, thereby forming a pixel defining area with the planarizing layer 46.

An organic layer 62, which includes a light emitting layer, is formed to cover a portion of the surface, or the entire surface, of the exposed first electrode layer 61. A second electrode layer 63 covers the organic layer 62 to complete the OLED.

The OLED, which emits red, green, or blue light according to a current flow, includes the first electrode layer 61, the second electrode layer 63, and the organic layer 62 interposed therebetween. The second electrode layer 63 may cover the entire pixel.

The first electrode layer 61 may be an anode electrode, and the second electrode layer 63 may be a cathode electrode. On the other hand, the first electrode layer 61 may be a cathode electrode, and the second electrode layer 63 may be an anode electrode.

A manufacturing process of an organic electroluminescence display device according to an exemplary embodiment of the present invention utilizes fewer masks as compared to conventional techniques. Accordingly, the manufacturing process of the present invention may be quicker and cheaper.

In an organic electroluminescence display device according to an exemplary embodiment of the present invention, a source/drain electrode or signal lines connected to the source/drain electrode may reflect light emitted in lateral directions from an organic layer to an area where images are formed. As a result, light efficiency may be improved, which leads to decreased power consumption. The reduced power consumption may prevent organic layer deterioration, thereby increasing the device's lifespan.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents. For example, in the above-described embodiments, a pixel of the effective display area 110 includes two TFTs, but the present invention is not limited thereto. That is, the pixel may include a plurality of TFTs. In other words, even though only two TFTs are disposed in a pixel in the drawings, more TFTs can be disposed in the actual planar structure depending on a circuit design.

What is claimed is:

1. An organic electroluminescence display device, comprising:
    a thin film transistor including:
        a semiconductor layer disposed over a substrate;
        a gate electrode disposed above the semiconductor layer; and
        a source electrode coupled to a source region of the semiconductor layer and a drain electrode coupled to a drain region of the semiconductor layer,
    a first electrode layer coupled to either the source electrode or the drain electrode, the first electrode layer and the gate electrode being disposed directly on the same layer, the first electrode being made of a same material as the gate electrode, the first electrode having a same thickness as the gate electrode, all portions of the first electrode having a same layer structure as the gate electrode;
    a second electrode layer disposed above the first electrode layer; and
    an organic layer interposed between the first electrode layer and the second electrode layer and including at least a light emitting layer.

2. The organic electroluminescence display device of claim 1, further comprising a first insulator interposed between the semiconductor layer and the gate electrode,
    wherein the first electrode layer and the gate electrode are disposed on the first insulator.

3. The organic electroluminescence display device of claim 2, further comprising a second insulator interposed between the gate electrode and the source and drain electrodes,
    wherein the first electrode layer is disposed in an open area of the second insulator.

4. The organic electroluminescence display device of claim 3, wherein the second insulator is a single layer, a lower surface of the single layer contacts the gate electrode, and an upper surface of the single layer contacts the source and drain electrodes.

5. The organic electroluminescence display device of claim 3, further comprising:
    a pixel defining layer that covers the thin film transistor and exposes a portion of the first electrode layer,
    wherein the organic layer is disposed on a portion of the exposed first electrode layer.

6. The organic electroluminescence display device of claim 5, wherein an upper surface of the organic layer is lower than an upper surface of the source electrode or the drain electrode.

7. The organic electroluminescence display device of claim 5, further comprising:

a first signal line coupled to either of the source electrode or the drain electrode, wherein an upper surface of the organic layer is lower than an upper surface of the first signal line.

8. The organic electroluminescence display device of claim 7, further comprising:

a switching transistor having a first electrode coupled with the gate electrode of the thin film transistor and a second electrode coupled to a second signal line, wherein the upper surface of the organic layer is lower than an upper surface of the second signal line.

9. The organic electroluminescence display device of claim 1, wherein the first electrode layer comprises a metallic material.

10. The organic electroluminescence display device of claim 9, wherein the first electrode layer comprises at least one selected from the group consisting of Mo, MoW, Cr, Ni, Al, an Al alloy, Ag, ITO, and IZO.

* * * * *

UNITED STATES PATENT AND TRADEMARK OFFICE
CERTIFICATE OF CORRECTION

PATENT NO. : 7,626,330 B2 Page 1 of 1
APPLICATION NO. : 11/062938
DATED : December 1, 2009
INVENTOR(S) : Park et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 814 days.

Signed and Sealed this

Second Day of November, 2010

David J. Kappos
*Director of the United States Patent and Trademark Office*